(12) United States Patent
Lin et al.

(10) Patent No.: US 9,412,425 B2
(45) Date of Patent: *Aug. 9, 2016

(54) DEVICE AND METHOD FOR IMPROVING READING SPEED OF MEMORY

(71) Applicant: MACRONIX INTERNATIONAL CO., LTD., Hsinchu (TW)

(72) Inventors: Yung-Feng Lin, Taoyuan County (TW); Su-Chueh Lo, Hsinchu (TW); Tai-Feng Chen, Suzhou (CN); Yi-Fan Chang, Pingjhen (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/673,530

(22) Filed: Mar. 30, 2015

(65) Prior Publication Data

US 2015/0206557 A1 Jul. 23, 2015

Related U.S. Application Data

(63) Continuation of application No. 13/801,500, filed on Mar. 13, 2013, now Pat. No. 9,001,604.

(51) Int. Cl.
| | |
|---|---|
| *G11C 7/00* | (2006.01) |
| *G11C 7/08* | (2006.01) |
| *G11C 7/06* | (2006.01) |
| *G11C 7/10* | (2006.01) |
| *G11C 7/12* | (2006.01) |

(52) U.S. Cl.
CPC .. *G11C 7/08* (2013.01); *G11C 7/06* (2013.01); *G11C 7/1012* (2013.01); *G11C 7/1048* (2013.01); *G11C 7/1051* (2013.01); *G11C 7/1069* (2013.01); *G11C 7/12* (2013.01)

(58) Field of Classification Search
USPC .......................................................... 365/203
See application file for complete search history.

(56) References Cited

U.S. PATENT DOCUMENTS

| | | | |
|---|---|---|---|
| 5,539,700 A * | 7/1996 | Kawahara | G11C 8/18 365/189.09 |
| 6,917,535 B2 * | 7/2005 | Shiratake | G11C 7/1048 365/145 |
| 9,001,604 B2 | 4/2015 | Lin et al. | |
| 2008/0285367 A1 | 11/2008 | Jung et al. | |

* cited by examiner

*Primary Examiner* — Anthan Tran
(74) *Attorney, Agent, or Firm* — Yiding Wu; Haynes Beffel & Wolfeld LLP

(57) ABSTRACT

A memory device includes a plurality of sense amplifiers coupled with an array of memory cells, a plurality of output data lines receiving outputs of corresponding sense amplifiers, and a plurality of precharge circuits configured to apply a precharge voltage on the output data lines. A controller provides control signals to the sense amplifiers and to the precharge circuits, including to cause the precharge circuits to precharge the output data lines before the sense amplifiers drive output data signals to the output data lines. The plurality of sense amplifiers includes banks of sense amplifiers, and each bank includes a sense amplifier having an output driving each output data line. The memory device includes data output multiplexers having inputs coupled to the output data lines, and the precharge circuits are coupled to the output data lines between outputs of the sense amplifiers and the data output multiplexers.

27 Claims, 11 Drawing Sheets

DEVICE AND METHOD FOR IMPROVING READING SPEED OF MEMORY

PRIORITY APPLICATIONS

This application is a continuation of U.S. application Ser. No. 13/801,500, filed 13 Mar. 2013 entitled Device and Method for Improving Reading Speed of Memory, and has issued as U.S. Pat. No. 9,001,604 on 7 Apr. 2015, and is incorporated herein by reference.

BACKGROUND

1. Field of the Invention

The present invention relates to integrated circuit memory devices, and to circuitry for providing output data on such memory devices.

2. Description of Related Art

Integrated circuit memory devices are becoming denser and faster. Groups of sense amplifiers are used for reading data from memory arrays. There can be a large number of data lines used to transfer output data from banks of sense amplifiers to output circuits on the memory devices, which can include multiplexers and output buffers. To save layout area, data lines can be placed closely together. However, one side effect is that the capacitive coupling effect between the data lines degrades the signal transition time and slows down the reading speed because of the delay from the output of the sense amplifiers to the output circuits.

It is desirable to improve reading speed on integrated circuits by addressing these problems.

SUMMARY

A memory device includes a plurality of sense amplifiers coupled with an array of memory cells, and a plurality of output data lines receiving outputs of corresponding sense amplifiers in the plurality of sense amplifiers. The memory device includes a plurality of precharge circuits configured to apply a precharge voltage on the output data lines. The precharge circuits precharge the output data lines before the sense amplifiers drive output data signals to the output data lines. The memory device includes a controller that provides control signals to the sense amplifiers in the plurality of sense amplifiers and to the precharge circuits in the plurality of precharge circuits, including to cause the precharge circuits to precharge the output data lines before the sense amplifiers drive output data signals to the output data lines. The plurality of sense amplifiers includes banks of sense amplifiers, and each bank includes a sense amplifier having an output driving each output data line in the plurality of output data lines. The memory device further includes data output multiplexers having inputs coupled to the output data lines, and the precharge circuits are coupled to the output data lines between outputs of the sense amplifiers and the data output multiplexers.

A method for sensing data using the memory device is also provided.

Other aspects and advantages of the present invention can be seen on review of the drawings, the detailed description and the claims, which follow.

DETAILED DESCRIPTION

A detailed description of embodiments of the present invention is provided with reference to the FIGS. 1-11.

Figure 1:
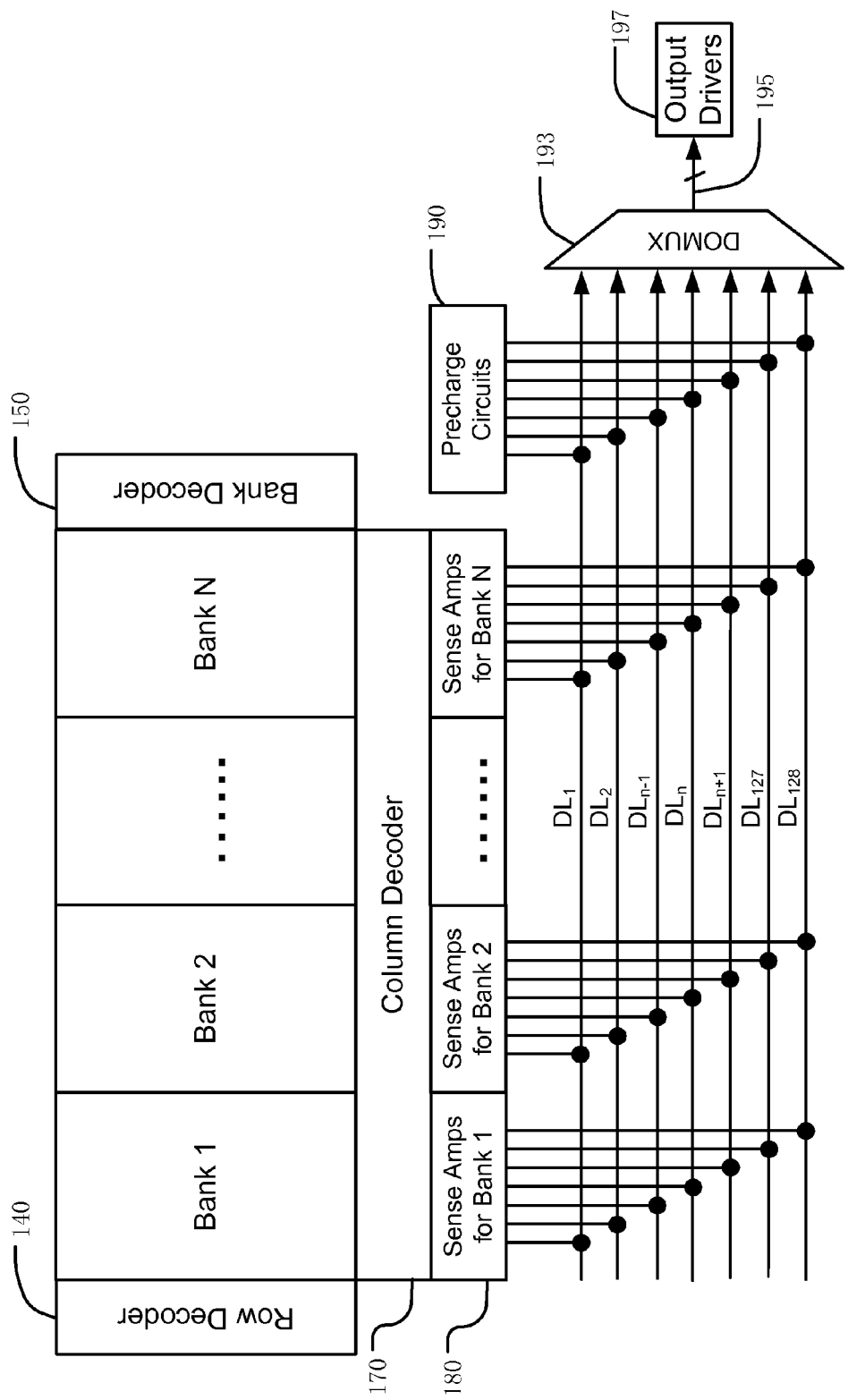
FIG. 1 is a simplified block diagram of a memory device illustrating output data lines used for carrying sensed data from selected memory banks to data output multiplexers.

FIG. 1 is a simplified block diagram illustrating a memory device including output data lines used for carrying sensed data from selected memory banks to data output multiplexers. The memory device includes a plurality of sense amplifiers coupled with an array of memory cells, a plurality of output data lines receiving outputs of corresponding sense amplifiers in the plurality of sense amplifiers, and a plurality of precharge circuits configured to apply a precharge voltage on the output data lines. The plurality of sense amplifiers includes a plurality of banks of sense amplifiers, and each bank includes a sense amplifier having an output driving each output data line in the plurality of output data lines.

In the example shown in FIG. 1, the memory device includes N memory banks Bank 1, Bank 2, ... Bank N, where N can be 4, 8, 16, etc. The memory device includes 128 output data lines including output data lines $DL_1$, $DL_2$, $DL_{n-1}$, $DL_n$, $DL_{n+1}$, $DL_{127}$, and $DL_{128}$. Each memory bank can include an array of memory cells, including a plurality of columns and a plurality of rows. In the example shown in FIG. 1, each bank can include 128 columns. A row decoder 140 is coupled to a plurality of word lines, and a column decoder 170 is coupled to a plurality of bit lines. Sense amplifiers 180 are coupled to the column decoder 170 on inputs of sense amplifiers 180.

In the example shown in FIG. 1, the memory device further includes data output multiplexers 193 that have inputs coupled to the output data lines $DL_1$, $DL_2$, $DL_{n-1}$, $DL_n$, $DL_{n+1}$, $DL_{127}$, and $DL_{128}$. Precharge circuits 190 are coupled to output data lines e.g. $DL_1$, $DL_2$, ..., $DL_{n-1}$, $DL_n$, $DL_{n+1}$, ..., $DL_{127}$, and $DL_{128}$ between outputs of the sense amplifiers 180 and inputs of the data output multiplexers 193. Output data are supplied via output data lines $DL_1$, $DL_2$, ..., $DL_{n-1}$, $DL_n$, $DL_{n+1}$, ..., $DL_{127}$, and $DL_{128}$ from outputs of the sense amplifiers 180 to inputs of the data output multiplexers 193. Data output multiplexers 193 select sensed data on the 128 output data lines, and output sensed data from a subset of the 128 output data lines. In one embodiment, data output multiplexers 193 can output 16 bits of data from 16 output data lines among the 128 output data lines. Output drivers 197 have inputs coupled to outputs of data output multiplexers 193 via data lines 195. Output drivers 197 drive selected sensed data to destinations external to the memory device.

An output data line (e.g. $DL_n$) among the 128 output data lines can be coupled to a corresponding sense amplifier in each of the N memory banks. For example, if N=16, the output data line $DL_n$ can be coupled to outputs of 16 sense amplifiers, where each of the 16 sense amplifiers is from a different memory bank. If a memory bank is selected, for example by a bank decoder 150, output buffer of a sense amplifier for the memory bank can actively drive an output data line (e.g. $DL_n$) to a voltage level corresponding to data at new logic level (1 or 0). Alternatively, if a memory bank is selected, output buffer of a sense amplifier for the memory bank can be at a high impedance state, not driving the output data line that receives output of the sense amplifier. If a memory bank is not selected, output buffers of sense amplifiers for the memory bank are at a high impedance state, not driving the output data lines that receive outputs of the sense amplifiers.

Because of the multiplicity of the output data lines (e.g. 128), the lengths of the output data lines, and the tight placement of the output data lines, parasitic capacitance among output data lines can require extra charging time during data transitions and thus affect data rates for data transfer on the output data lines. For instance, output data lines can have a length of about 5,000 µm (micrometers), a width of about 0.4 µm, a thickness of about 0.8 µm, a spacing between two adjacent output data lines of about 0.4 µm, and parasitic capacitance of 0.5 pF (picofarads) between two adjacent output data lines. Most output data lines have adjacent output data lines on both sides so the combined parasitic capacitance coupled to a single output data line can be twice 0.5 pF or 1 pF.

To minimize the effects of parasitic capacitance on data transfer timing and consequently data rates, precharge circuits 190 precharge parasitic capacitances between output data lines simultaneously with sensing operations performed by sense amplifiers 180. Precharge circuits 190 and operations by precharge circuits 190 are further described herein.

Figure 2:
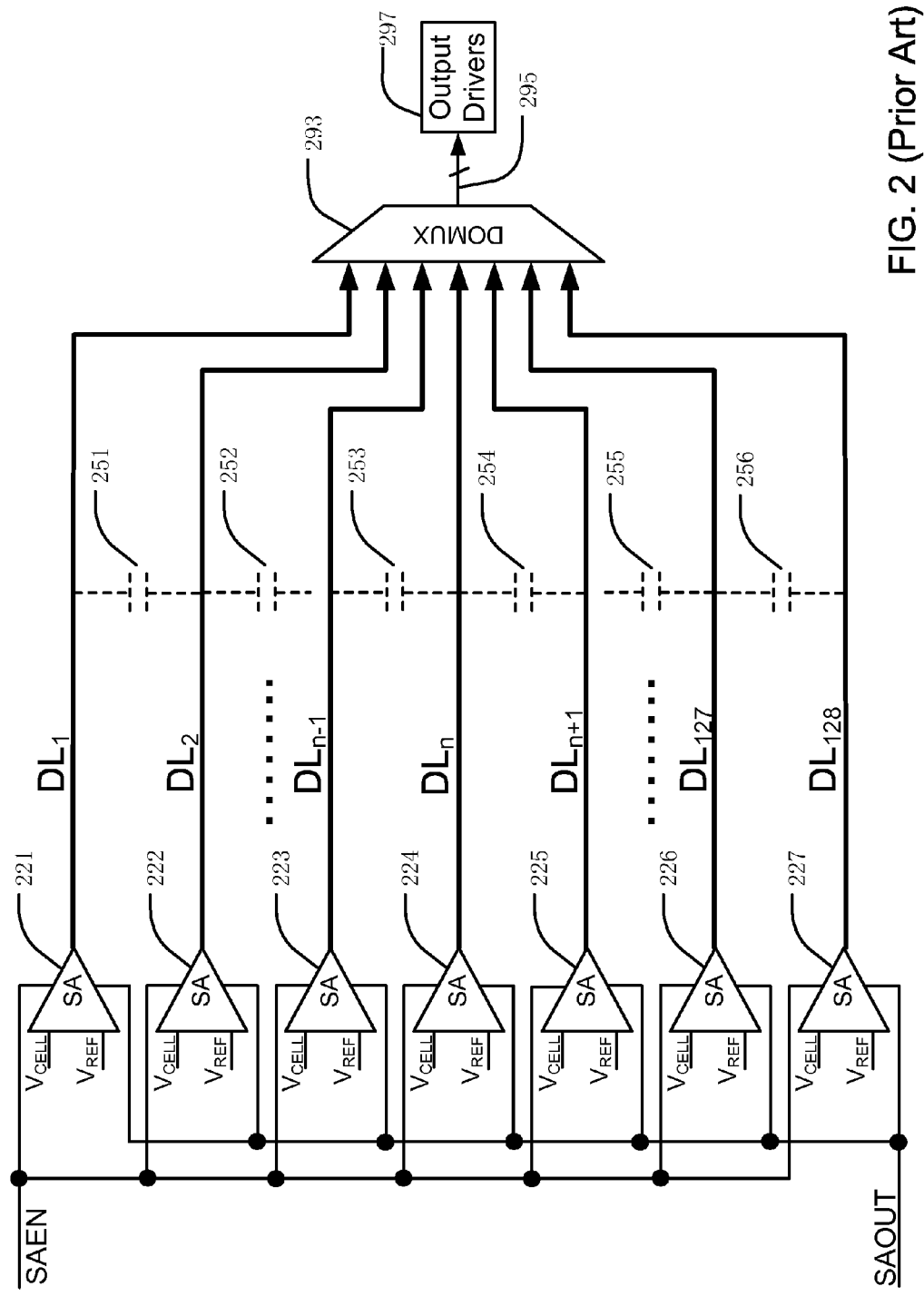
FIG. 2 is a schematic diagram illustrating a circuit including output data lines receiving outputs of sense amplifiers and with parasitic capacitances in-between (Prior Art).

FIG. 2 is a schematic diagram illustrating a circuit including output data lines receiving outputs of sense amplifiers and with parasitic capacitances in-between (Prior Art). The output data lines carry sensed data from outputs of sense amplifiers to data output multiplexers. In the example shown in FIG. 2, data output multiplexers 293 select sensed data on 128 output data lines from a memory bank, and provide sensed data from a subset of the 128 output data lines to the output drivers 297 via data lines 295. The output data lines have parasitic capacitances between adjacent output data lines. As an example, FIG. 2 illustrates output data lines $DL_1$, $DL_2$, ..., $DL_{n-1}$, $DL_n$, $DL_{n+1}$, ..., $DL_{127}$, and $DL_{128}$ in a memory array. In embodiments, the number of output data lines can be 64, 128, 256 etc, corresponding to the number of columns in a memory array. Each output data line is driven by a sense amplifier. For instance, as illustrated, output data lines $DL_1$, $DL_2$, ..., $DL_{n-1}$, $DL_n$, $DL_{n+1}$, $DL_{127}$, and $DL_{128}$ are driven by sense amplifiers 221-227.

FIG. 2 illustrates parasitic capacitances 251-256 between output data lines $DL_1$, $DL_2$, ..., $DL_{n-1}$, $DL_n$, $DL_{n+1}$, ..., $DL_{127}$, and $DL_{128}$. In the example shown in FIG. 2, parasitic capacitance 251 is between adjacent output data lines $DL_1$ and $DL_2$, and parasitic capacitance 256 is between adjacent output data lines $DL_{127}$ and $DL_{128}$.

In the example shown in FIG. 2, each of the sense amplifiers 221-227 has a sense node $V_{CELL}$, a second input coupled to a reference voltage $V_{REF}$, and an output connected to an output data line. The sense node $V_{CELL}$ is coupled to a selected memory cell in the memory array via column decoders. A sensing signal SAEN and an output control signal SAOUT are coupled to each of the sense amplifiers 221-227.

Figure 3:
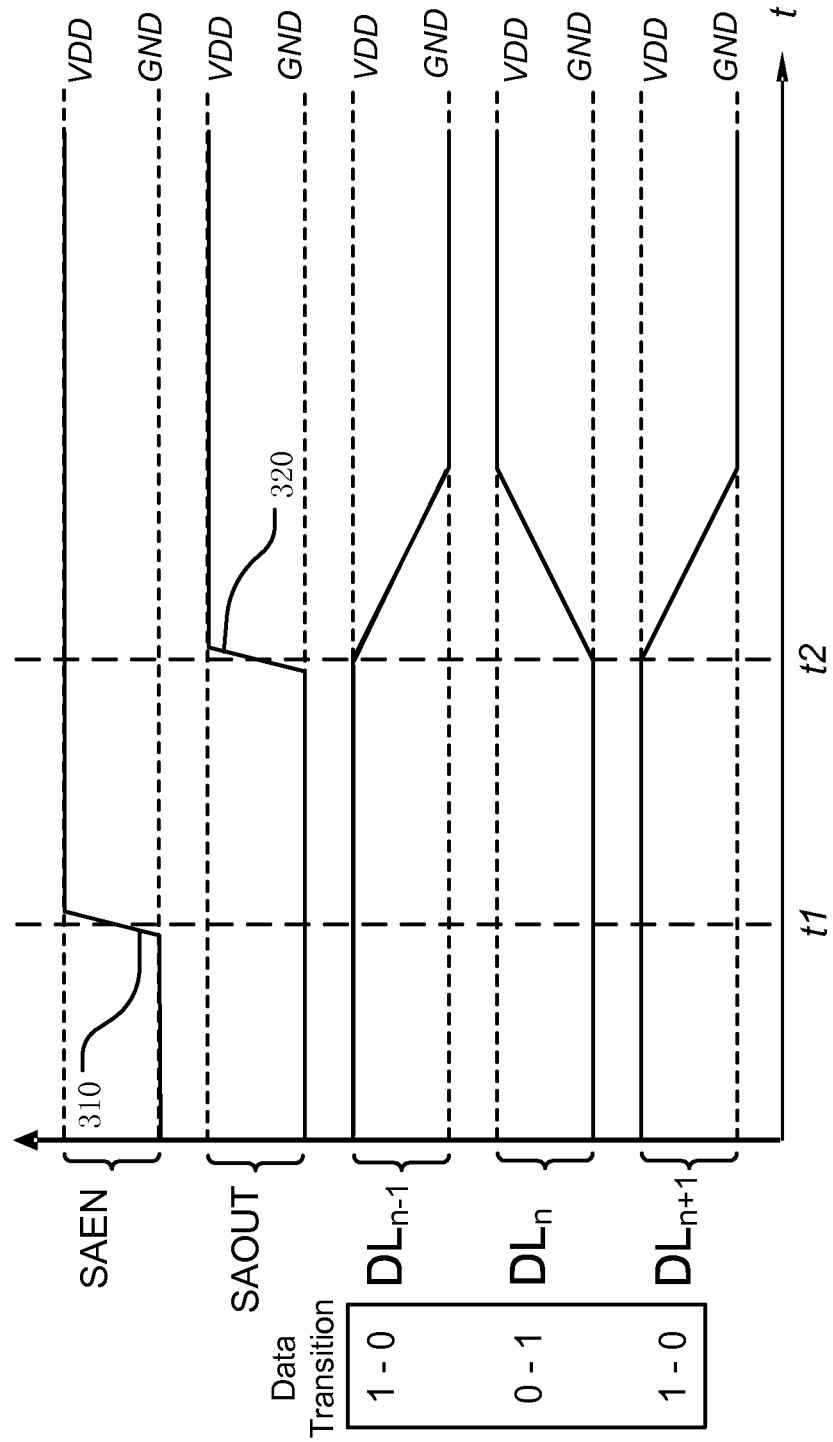
FIG. 3 is a timing diagram illustrating transfer timing on output data lines for the circuit illustrated in FIG. 2 (Prior Art).

FIG. 3 is a timing diagram illustrating transfer timing on output data lines for the circuit illustrated in FIG. 2 (Prior Art). FIG. 3 illustrates data on output data lines $DL_{n-1}$, $DL_n$, and $DL_{n+1}$ that switch between a first voltage level VDD corresponding to data at logic high and a second voltage level GND corresponding to data at logic low. FIG. 3 illustrates a sensing interval as between the transition 310 from logic low to logic high in the sensing signal SAEN at time t1, and the transition 320 from logic low to logic high in the output control signal SAOUT at time t2. Alternatively, the transition in the sensing signal SAEN can be from logic high to logic low, and the transition in the output control signal SAOUT can be from logic high to logic low. During an initial interval that ends at time t1, data on output data lines $DL_{n-1}$, $DL_n$, and $DL_{n+1}$ are retained from previous sensing operations. During the sensing interval between time t1 and time t2, data on output data lines $DL_{n-1}$, $DL_n$, and $DL_{n+1}$ remain unchanged. When an output interval starts at time t2 subsequent to the sensing interval, data on output data lines $DL_{n-1}$, $DL_n$, and $DL_{n+1}$ begin to change as driven by output buffers in the sense amplifiers from voltage levels corresponding to data retained from previous sensing operations to voltage levels corresponding to currently sensed data.

In the example shown in FIG. 3, data on output data lines $DL_{n-1}$, and $DL_{n+1}$ change from VDD to GND, while data on output data lines $DL_n$ changes from GND to VDD. In reference to FIG. 2, the parasitic capacitance 253 is between output data lines $DL_{n-1}$ and $DL_n$, and the parasitic capacitance 254 is between output data lines $DL_n$ and $DL_{n+1}$. Consequently, voltage on one terminal of the parasitic capacitance 253 changes from VDD to GND, while voltage on another terminal of the parasitic capacitance 253 changes from GND to VDD. Further, voltage on one terminal of parasitic capacitance 254 changes from GND to VDD, while voltage on another terminal of the parasitic capacitance 254 changes from VDD to GND.

In general, change in voltage difference across a parasitic capacitance can lead to capacitive charging, which in turn causes delay in transfer timing from one voltage level to another voltage level, since the transfer timing is a function of capacitance. Both the parasitic capacitance 253 and the parasitic capacitance 254 are coupled to the output data line $DL_n$. A worst case in transfer timing occurs for the output data line $DL_n$ when the output data lines $DL_{n-1}$, and $DL_{n+1}$ have a direction of voltage change (e.g. VDD to GND) opposite a direction of voltage change (e.g. GND to VDD) for $DL_n$, and both parasitic capacitances coupled to the output data line $DL_n$ are charged simultaneously by the sense amplifier coupled to the output data line $DL_n$, causing extra timing delay.

If an output data line charges a parasitic capacitance from GND to VDD via one of two terminals of the parasitic capacitance, while the other one of the two terminals remains at GND (e.g. 0V) during the charging process, then the charge provided by the sense amplifier coupled to the output data line can be characterized as CC×VDD, where CC is the capacitance of the parasitic capacitance.

If an output data line (e.g. $DL_n$) charges two parasitic capacitances (e.g. 253, 254) from GND to VDD via one of two terminals of each of the two parasitic capacitances, while the other one of two terminals of each of the two parasitic capacitances remains at GND during the charging process, then the total charge provided by the sense amplifier coupled to the output data line $DL_n$ can be characterized as 2×CC×VDD.

In the worst case example shown in FIG. 3, an output data line (e.g. $DL_n$) charges two parasitic capacitances (e.g. 253, 254) from GND to VDD via first terminals of two terminals of both parasitic capacitances, while voltages at second terminals of the two terminals of both parasitic capacitances simultaneously change from VDD to GND. In the worst case, the total charge provided by the sense amplifier coupled to the output data line $DL_n$ can be characterized as 2×2×CC×VDD.

One of the factor of 2 in 2×2×CC×VDD is for the fact that the sense amplifier simultaneously charges two parasitic capacitances coupled to an output data line. The other factor of 2 is for the fact that, during the charging process, a first direction of voltage change (e.g. from GND to VDD) at first terminals of the two terminals of both parasitic capacitances is opposite a second direction of voltage change (e.g. from VDD to GND) at second terminals of the two terminals of both parasitic capacitances. Opposite directions can also include a first direction of voltage change from VDD to GND at the first terminals, and a second direction of voltage change from GND to VDD at the second terminals. Consequently, the maximum total voltage swing between two terminals of each of the two parasitic capacitance is 2×VDD.

Figure 4:
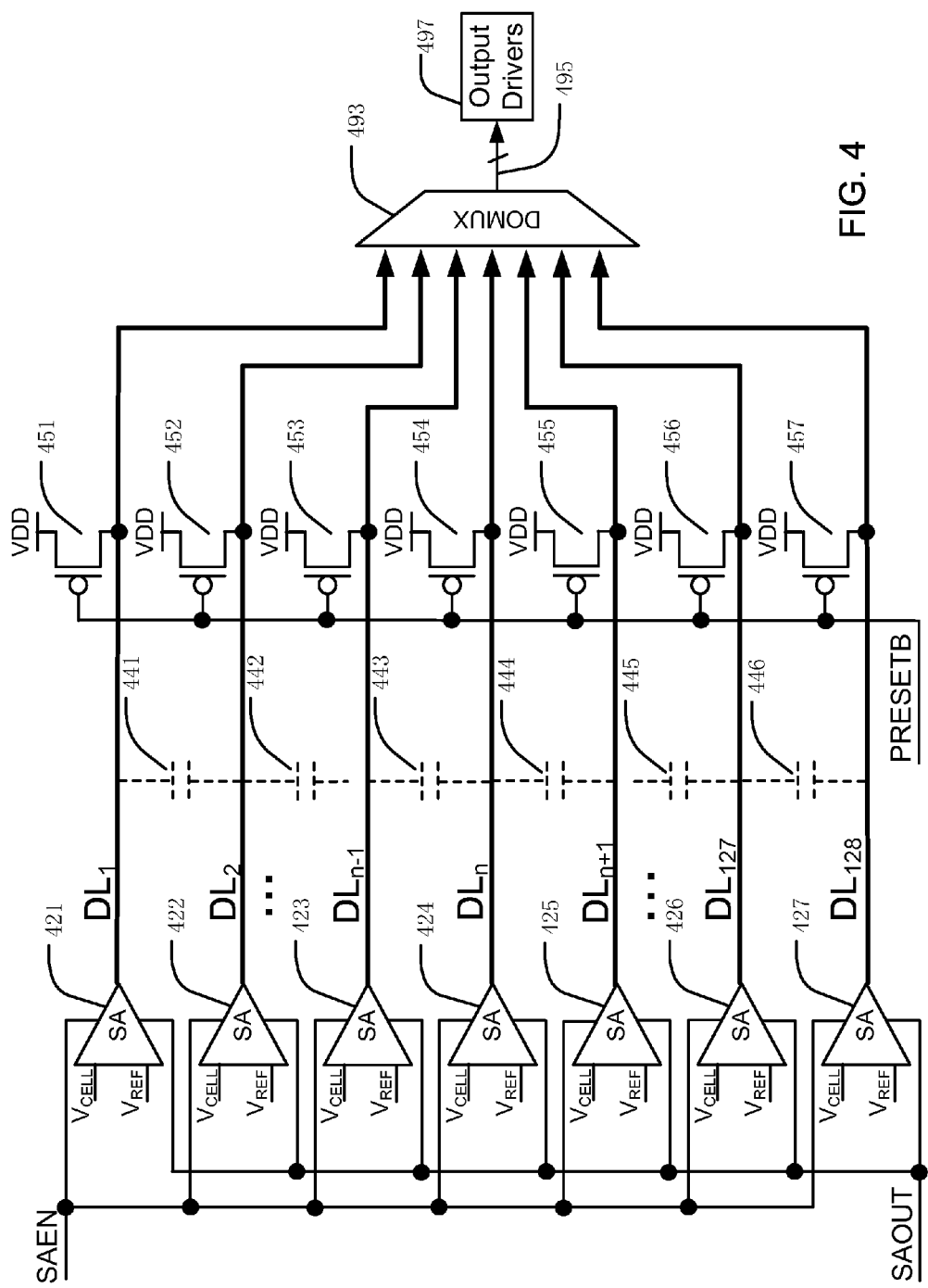
FIG. 4 is a schematic diagram illustrating an embodiment of precharge circuits configured to apply a precharge voltage on output data lines in a memory device in accordance with the present invention.

FIG. 4 is a schematic diagram illustrating an embodiment of precharge circuits configured to apply a precharge voltage on output data lines in a memory device in accordance with the present invention. The memory device includes an array of memory cells. The memory device includes a plurality of sense amplifiers coupled with the array, a plurality of output data lines receiving outputs of corresponding sense amplifiers in the plurality of sense amplifiers, and a plurality of precharge circuits configured to apply a precharge voltage on the output data lines. The output data lines carry sensed data from outputs of sense amplifiers to data output multiplexers 493. Data output multiplexers 493 select sensed data on 128 output data lines from a memory bank, and provide sensed data from a subset of the 128 output data lines to output drivers 497 via data lines 495.

In the example shown in FIG. 4, a memory device includes a plurality of output data lines including output data lines $DL_1, DL_2, \ldots, DL_{n-1}, DL_{n+1}, \ldots, DL_{127}$, and $DL_{128}$. In embodiments, the number of output data lines can be 64, 128, 256 etc, corresponding to the number of columns in a memory array. Each output data line is coupled to at least an output of a sense amplifier. For instance, output data lines $DL_1, DL_2, DL_{n-1}, DL_n, DL_{n+1}, DL_{127}$, and $DL_{128}$ are coupled to outputs of sense amplifiers 421-427. FIG. 4 illustrates parasitic capacitances 441-446 between output data lines $DL_1, DL_2, \ldots, DL_{n-1}, DL_n, DL_{n+1}, \ldots, DL_{127}$, and $DL_{128}$. As an example, parasitic capacitance 441 is between adjacent output data lines $DL_1$ and $DL_2$, and parasitic capacitance 446 is between adjacent output data lines $DL_{127}$ and $DL_{128}$.

In the example shown in FIG. 4, each of the sense amplifiers 421-427 has a sense node $V_{CELL}$, a second input coupled to a reference voltage $V_{REF}$, and an output driving an output data line. The sense node $V_{CELL}$ is coupled to a selected memory cell in a memory array. A sensing signal SAEN and an output control signal SAOUT are coupled to each of the sense amplifiers 421-427.

In this embodiment, a precharge circuit (e.g. 451) is coupled to an output data line (e.g. $DL_1$) in the plurality of output data lines. The precharge circuit includes a first terminal coupled to a precharge voltage (e.g. VDD), a second terminal coupled to the output data line (e.g. $DL_1$), and a gate terminal coupled to a precharge signal PRESETB provided by a controller. In the example shown in FIG. 4, precharge circuits 451-457 are coupled to output data lines $DL_1, DL_2, DL_{n-1}, DL_n, DL_{n+1}, DL_{127}$, and $DL_{128}$, respectively.

Electrically, the output data line switches between a first voltage level VDD corresponding to data at logic high and a second voltage level GND corresponding to data at logic low. Although the precharge voltage is shown at VDD in FIG. 4, the precharge voltage coupled to the first terminal of the precharge circuit can be at VDD or GND.

Although only PMOS transistors are shown for precharge circuits (e.g. 451) in FIG. 4, precharge circuits can include PMOS transistors, NMOS transistors, or CMOS transistors. If a precharge circuit includes a CMOS transistor, the precharge circuit has a second gate terminal coupled to a complementary precharge signal provided by the controller.

Figure 5:
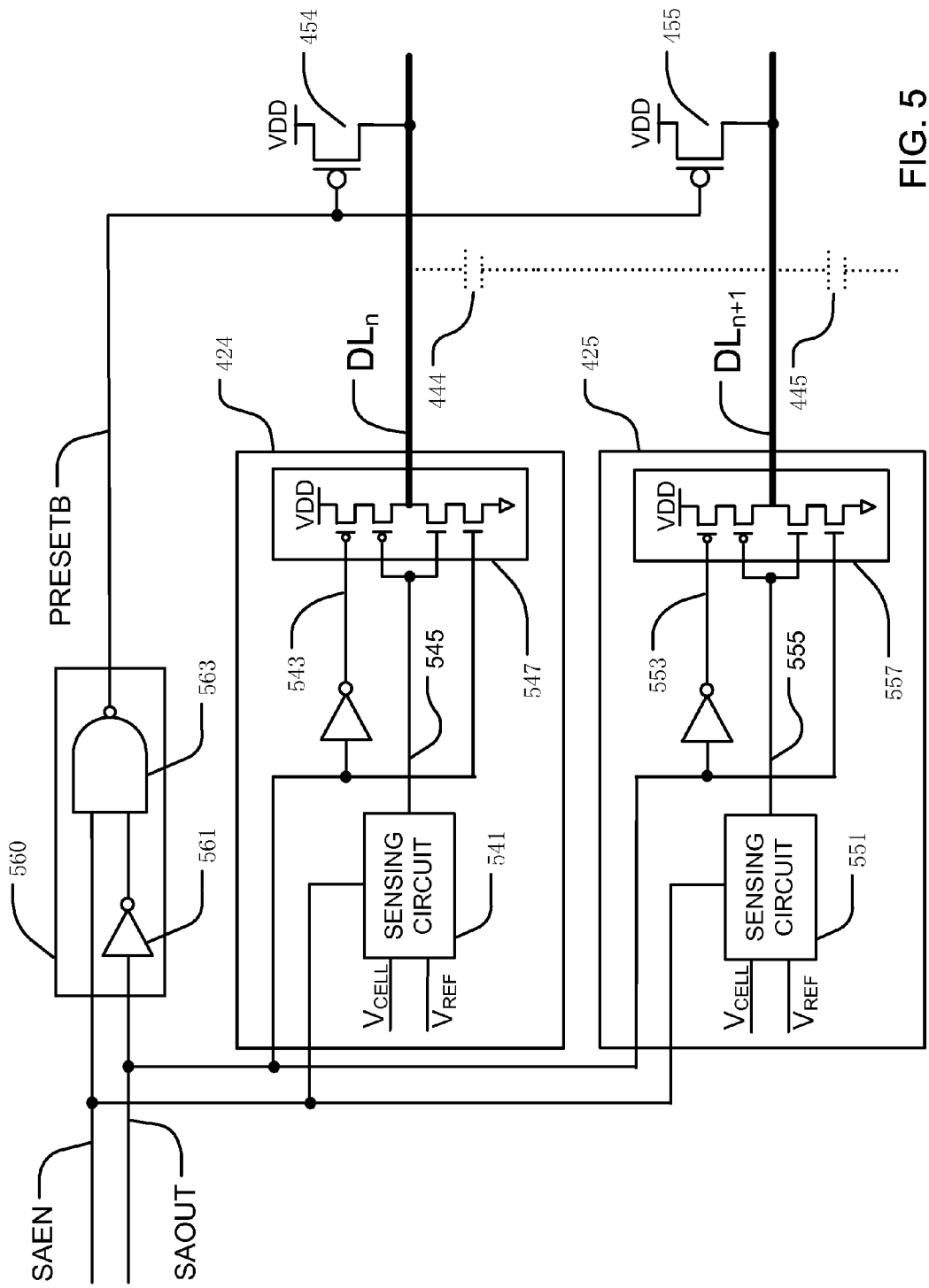
FIG. 5 is a schematic diagram illustrating an example of output data lines driven by sense amplifiers and coupled to precharge circuits with control signals in a memory device.

FIG. 5 is a schematic diagram illustrating an example of output data lines driven by sense amplifiers and coupled to precharge circuits with control signals in a memory device. The memory device includes a controller that provides the control signals including a sensing signal SAEN, an output control signal SAOUT, and a precharge signal PRESETB. The precharge signal is generated in coordination with at least one of the sensing signal SAEN and the output signal to ensure that precharging operations by precharge circuits are carried out simultaneously with sensing operations by sense amplifiers such that the precharging operations do not increase timing delays on output data lines between sense amplifiers that drive the output data lines and data output multiplexers (e.g. 193, FIG. 1) that receive data on the output data lines.

The controller enables the sense amplifiers (e.g. 424, 425) in the plurality of sense amplifiers to sense data at data inputs (e.g. $V_{CELL}$) of the sense amplifiers (e.g. 424, 425) during a sensing interval starting at a first time, for example via the sensing signal SAEN. The controller enables the sense amplifiers (e.g. 424, 425) to output sensed data to the output data lines (e.g. $DL_n, DL_{n+1}$) at a second time subsequent to the first time, for example via the output control signal SAOUT. The controller enables the precharge circuits (e.g. 454, 455) to precharge the output data lines (e.g. $DL_n, DL_{n+1}$) during a precharge interval prior to the second time, for example via the precharge signal PRESETB. The precharge interval can be shorter than or equal to the sensing interval.

In the example shown in FIG. 5, the precharge signal PRESETB is generated as a function of at least one of the sensing signal SAEN and the output control signal SAOUT, for example by a sub-circuit 560. The sub-circuit 560 uses a NAND gate 563 and an inverter or a NOT gate 561. The function of the precharge signal can be expressed as: PRESETB=(SAEN NAND (NOT SAOUT)). Those of ordinary skill in the art can readily devise variations to the function. Example timing relationship between the precharge signal PRESETB and the sensing signal SAEN and the output control signal SAOUT is illustrated in FIGS. 6, 7, 9, and 10.

In the example shown in FIG. 5, two sense amplifiers 424 and 425 illustrate more details than in FIG. 4. Each of the sense amplifiers has a sense node $V_{CELL}$, a second input coupled to a reference voltage $V_{REF}$, and an output connected to an output data line. A sense node $V_{CELL}$ is coupled to a selected memory cell in the memory array. The sensing signal SAEN and the output control signal SAOUT are coupled to the sense amplifiers 424 and 425. Precharge circuits 454 and 455 are coupled to output data lines $DL_n$ and $DL_{n+1}$, respectively. A parasitic capacitance 444 is shown between the output data lines $DL_n$ and $DL_{n+1}$.

Although the sensing signal SAEN and the output control signal SAOUT are illustrated as controlling only two sense amplifiers, in embodiments a sensing signal and an output signal can control more sense amplifiers, such as 32, 64, 128 sense amplifiers in one memory bank, and even sense amplifiers in multiple banks. Similarly, although the precharge signal PRESETB is illustrated as controlling only two precharge circuits, in embodiments a precharge signal can control more precharge circuits, such as 32, 64, 128 precharge circuits in one memory bank, and even precharge circuits in multiple banks.

Sense amplifier 424 includes a sensing circuit 541 and an output buffer circuit 547. Sensing circuit 541 senses a voltage difference between the sense node $V_{CELL}$ and the reference voltage $V_{REF}$ that represents a data value, such as binary 1 or 0, stored in a memory cell. Sensing circuit 541 provides sensed data 545 to an input of the output buffer circuit 547. The output buffer circuit 547 then amplifies the sensed data 545 to a logic level suitable for further processing in a memory device, and outputs the sensed data to the output data line $DL_n$. The output data line $DL_n$ is coupled to circuit elements such as data output multiplexers 193 (FIG. 1).

Similarly, sense amplifier 425 includes a sensing circuit 551 and an output buffer circuit 557. Sensing circuit 551 senses a voltage difference between the sense node WELL and the reference voltage $V_{REF}$ that represents a data value, such as binary 1 or 0, stored in a memory cell. Sensing circuit 551 provides sensed data 555 to an input of the output buffer circuit 557. The output buffer circuit 557 then amplifies the sensed data 555 to a logic level suitable for further processing in a memory device, and outputs the sensed data to the output data line $DL_{n+1}$. The output data line $DL_{n+1}$ is coupled to circuit elements such as data output multiplexers 193 (FIG. 1).

Parasitic capacitance between an output data line (e.g. $DL_n$) and an adjacent output data line (e.g. $DL_{n+1}$) can be 0.5 pF for example, and combined parasitic capacitance between an output data line (e.g. $DL_n$) and two adjacent output data lines (e.g. $DL_{n-1}$, $DL_{n+1}$) can be 1.0 pF. A total loading on an output data line can be 1.4 pF for example, including loading at inputs of the data output multiplexers and the combined parasitic capacitance between output data lines. Thus in comparison to the total loading, extra timing delay due to parasitic capacitance can be significant in data transfer.

Figure 6:
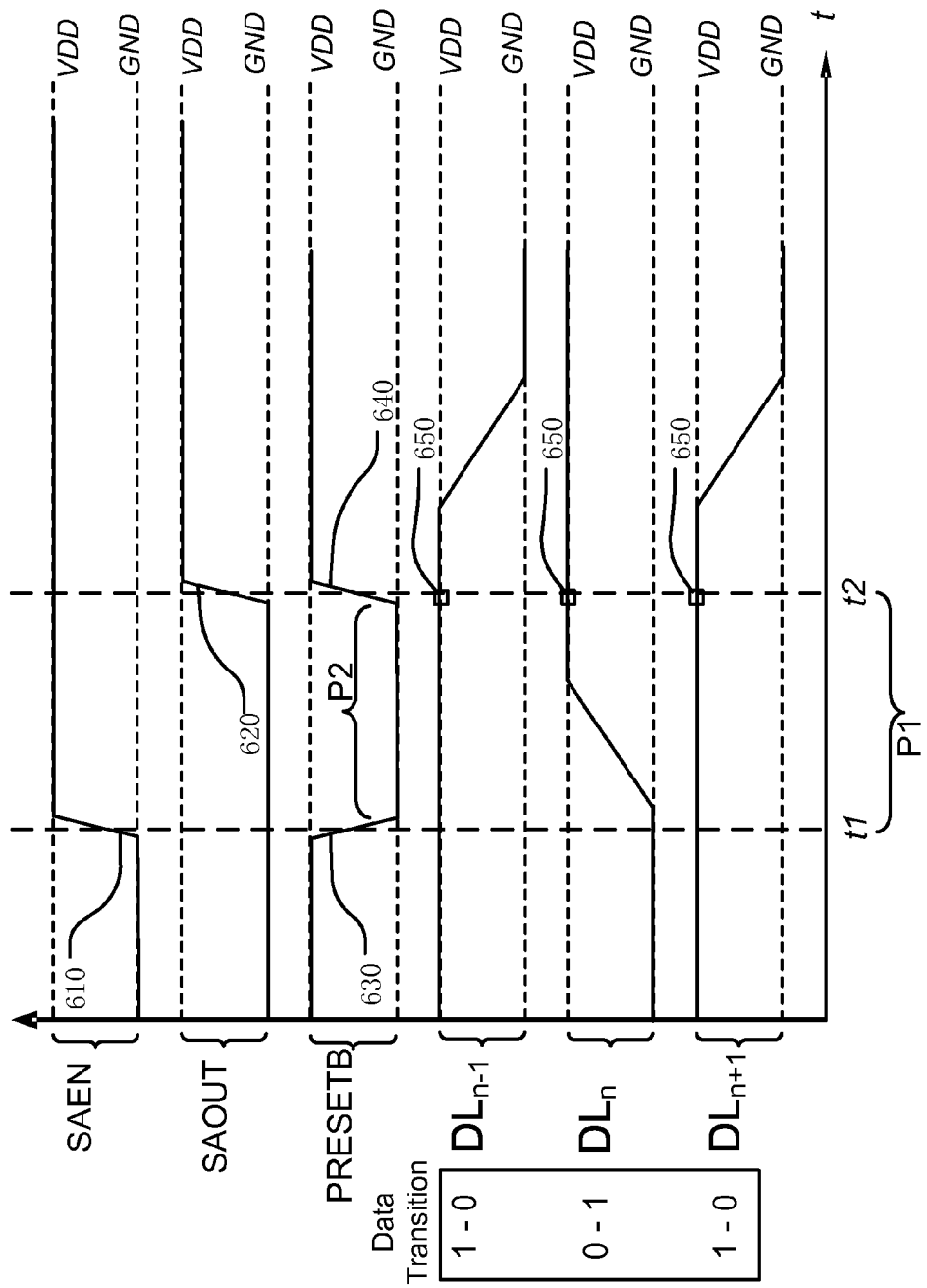
FIGS. 6 and 7 are timing diagrams for the embodiment of precharge circuits illustrated in FIGS. 4 and 5.
Figure 7:
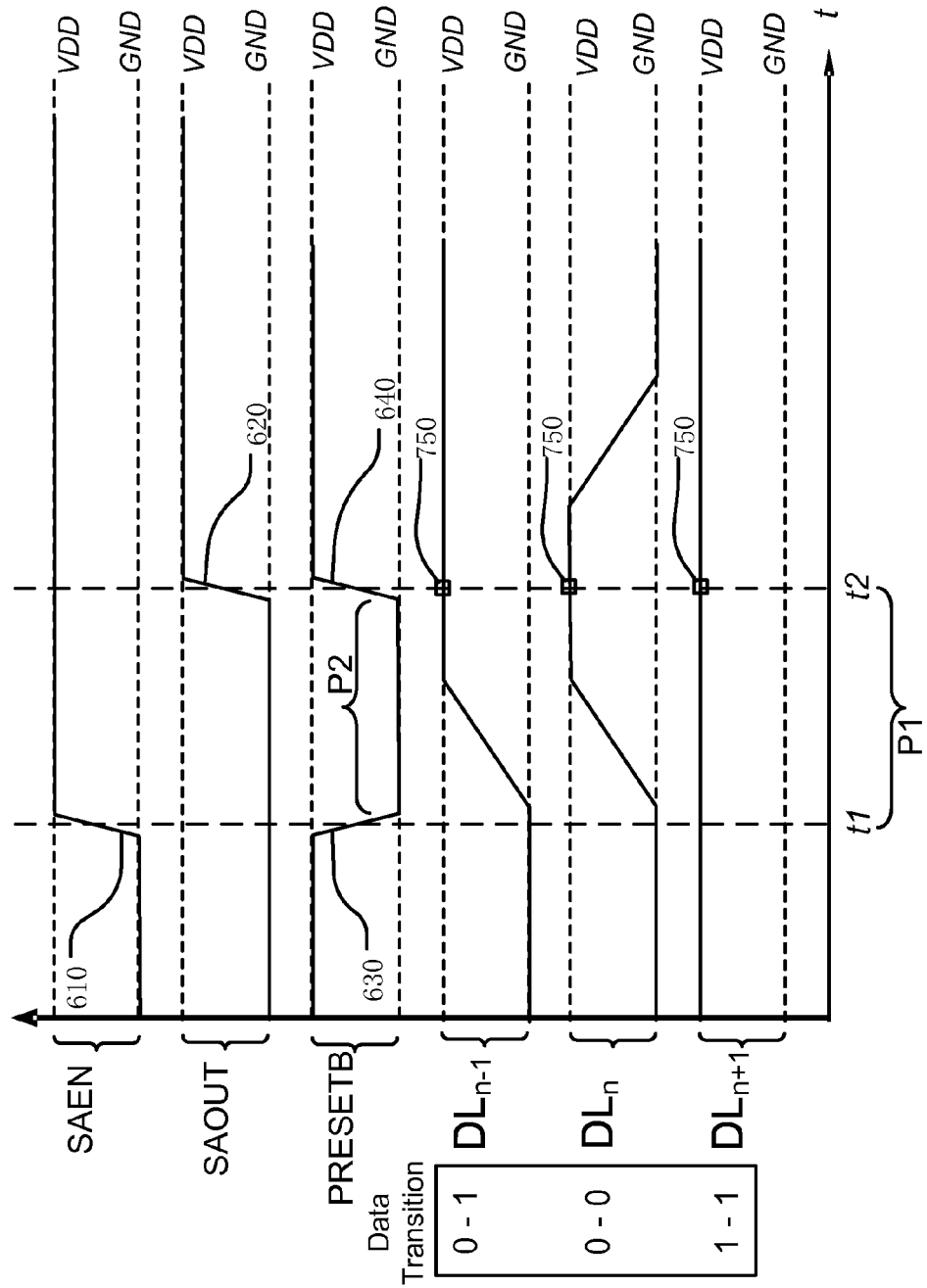

FIGS. 6 and 7 are timing diagrams for the embodiment of precharge circuits illustrated in FIGS. 4 and 5. In the examples shown in FIGS. 6 and 7, data on output data lines $DL_{n-1}$, $DL_n$, and $DL_{n+1}$ switch between a first voltage level VDD corresponding to data at logic high and a second voltage level GND corresponding to data at logic low. FIG. 6 illustrates a sensing interval P1 between the transition 610 from logic low to logic high in the sensing signal SAEN at a first time t1, and the transition 620 from logic low to logic high in the output control signal SAOUT at a second time t2 subsequent to the first time t1. Alternatively, the transition in the sensing signal SAEN can be from logic high to logic low, and the transition in the output control signal SAOUT can be from logic high to logic low.

FIG. 6 illustrates a precharge interval P2 shorter than or equal to the sensing interval P1 starting at or after the first time t1, and ends at or before the second time t2. In the example shown in FIG. 6, the precharge interval P2 is between the transition 630 from logic high to logic low, and the transition 640 from logic low to logic high in the precharge signal PRESETB. Alternatively, the transition 630 can be from logic low to logic high, and the transition 640 can be from logic high to logic low. In other embodiments, the precharge interval P2 for a current read cycle can start before the first time t1 for a current read cycle and after the second time t2 for an immediate previous read cycle if outputs of the sense amplifiers are not driving the data output lines between the second time t2 for the immediate previous read cycle and the first time t1 for the current read cycle.

In the example shown in FIG. 6, during an initial interval that ends at the first time t1, data on output data lines $DL_{n-1}$, $DL_n$, $DL_{n+1}$ are retained from previous sensing operations. During the sensing interval P1 between the first time t1 and the second time t2, the sense amplifier is enabled to sense data at data inputs of the sense amplifier in response to the sensing signal SAEN. During the precharge interval P2, data on output data lines $DL_{n-1}$, $DL_n$, $DL_{n+1}$ change from voltage levels retained from previous sensing operations to a precharge voltage 650 in response to the precharge signal PRESETB. In the example shown in FIG. 6, the precharge voltage 650 is at about a voltage level VDD corresponding to data at logic high. In another embodiment, the precharge voltage can be at about a voltage level GND corresponding to data at logic low.

The precharge signal PRESETB can turn on a precharge circuit (e.g. 454, FIG. 4) coupled to an output data line (e.g. $DL_n$, FIG. 4) during the precharge interval P2, and turn off the precharge circuit before and after the precharge interval P2. When the precharge circuit is turned on, the output data line coupled to the precharge circuit is precharged from a voltage level retained from previous sensing operations to a precharge voltage. The precharge voltage can include VDD and GND.

For instance, the first terminal of the precharge circuit 454 is coupled to the precharge voltage 650 at VDD (FIG. 4), and correspondingly the output data line DL (FIG. 5) is precharged to the precharge voltage 650 at VDD by the second time t2. Alternatively, if the first terminal of the precharge circuit 454 is coupled to a precharge voltage at GND, then correspondingly the output data line $DL_n$ is precharged to GND by the second time t2.

After the second time t2, the output data line is driven from the precharge voltage 650 at VDD to an output voltage level corresponding to data sensed at the sense node $V_{CELL}$ of the sense amplifier driving the output data line. The output voltage level includes VDD and GND.

As described in connection with FIG. 3 for the prior art, a worst case in transfer timing occurs for the output data line $DL_n$ when the output data lines $DL_{n-1}$ and $DL_{n+1}$ have a direction of voltage change (e.g. from VDD to GND) opposite a direction of voltage change for $DL_n$ (e.g. from GND to VDD). In reference to FIG. 4, the parasitic capacitance 443 is between output data lines $DL_{n-1}$ and $DL_n$, and the parasitic capacitance 444 is between output data lines $DL_n$ and $DL_{n+1}$.

In the example shown in FIG. 6, data on output data lines $DL_{n-1}$, and $DL_{n+1}$ change from VDD before the first time t1 to GND after the second time t2, while $DL_n$ changes from GND before the first time t1 to VDD after the second time t2. During the precharge interval P2, data on output data lines $DL_{n-1}$, $DL_n$, and $DL_{n+1}$ change to a precharge voltage 650 at about a voltage level VDD corresponding to data at logic high, regardless of the voltage levels retained from previous sensing operations. Consequently, after the second time t2 when the output control signal SAOUT is asserted, data on output data line $DL_n$ remains unchanged at VDD, reducing the need for charging the respective parasitic capacitances (e.g. 443 and 444, FIG. 4) and thus reducing the timing delay after the second time t2.

Description about the timing diagram in FIG. 6 is generally applicable to the timing diagram in FIG. 7. In the example shown in FIG. 7, data on output data line $DL_{n-1}$ changes from GND before the first time t1 to VDD after the second time t2, data on output data line $DL_n$ starts at GND before the first time t1 and ends at GND after the second time t2, while data on output data line $DL_{n+1}$ starts at VDD before the first time t1 and ends at VDD after the second time t2. During the precharge interval P2, data on output data lines $DL_{n-1}$, $DL_n$, and $DL_{n+1}$ change to a precharge voltage 750 at about a voltage level VDD corresponding to data at logic high, regardless of the voltage levels retained from previous sensing operations. Consequently, after the second time t2 when the output control signal SAOUT is asserted, data on output data lines $DL_{n-1}$ and data on output data line $DL_{n+1}$ remain unchanged at VDD.

In the examples shown in both FIG. 6 and FIG. 7, voltage changes from VDD to GND only at one terminal of the parasitic capacitance 443 between output data lines $DL_{n-1}$ and $DL_n$, and only at one terminal of the parasitic capacitance 444 between output data lines $DL_n$ and $DL_{n+1}$, resulting in a charge of 2×CC×VDD for both examples in FIG. 6 and FIG. 7, which is reduced from the worst case charge of 2×2×CC× VDD for the prior art as described in connection with FIG. 3.

Thus in the present embodiment, the sense amplifier coupled to the output data line $DL_n$ consumes less charge to drive the output data line $DL_n$ to a different voltage level than in the prior art under the same worst case scenario. The charge consumed in the worst case can be reduced from 2×2×CC× VDD to 2×CC×VDD, where CC is the capacitance of a parasitic capacitance, and the factor of 2 in 2×CC×VDD accounts for the fact that the parasitic capacitances on both sides of an output data line are simultaneously charged.

In the example shown in FIG. 6, data transitions correspond to a worst case occurring with the prior art described in connection with FIG. 3. In the example shown in FIG. 7, data transitions illustrate a case other than the worst case. In both cases, the charge consumed is about 2×CC×VDD, or half of the charge consumed for the worst case with the prior art.

Figure 8:
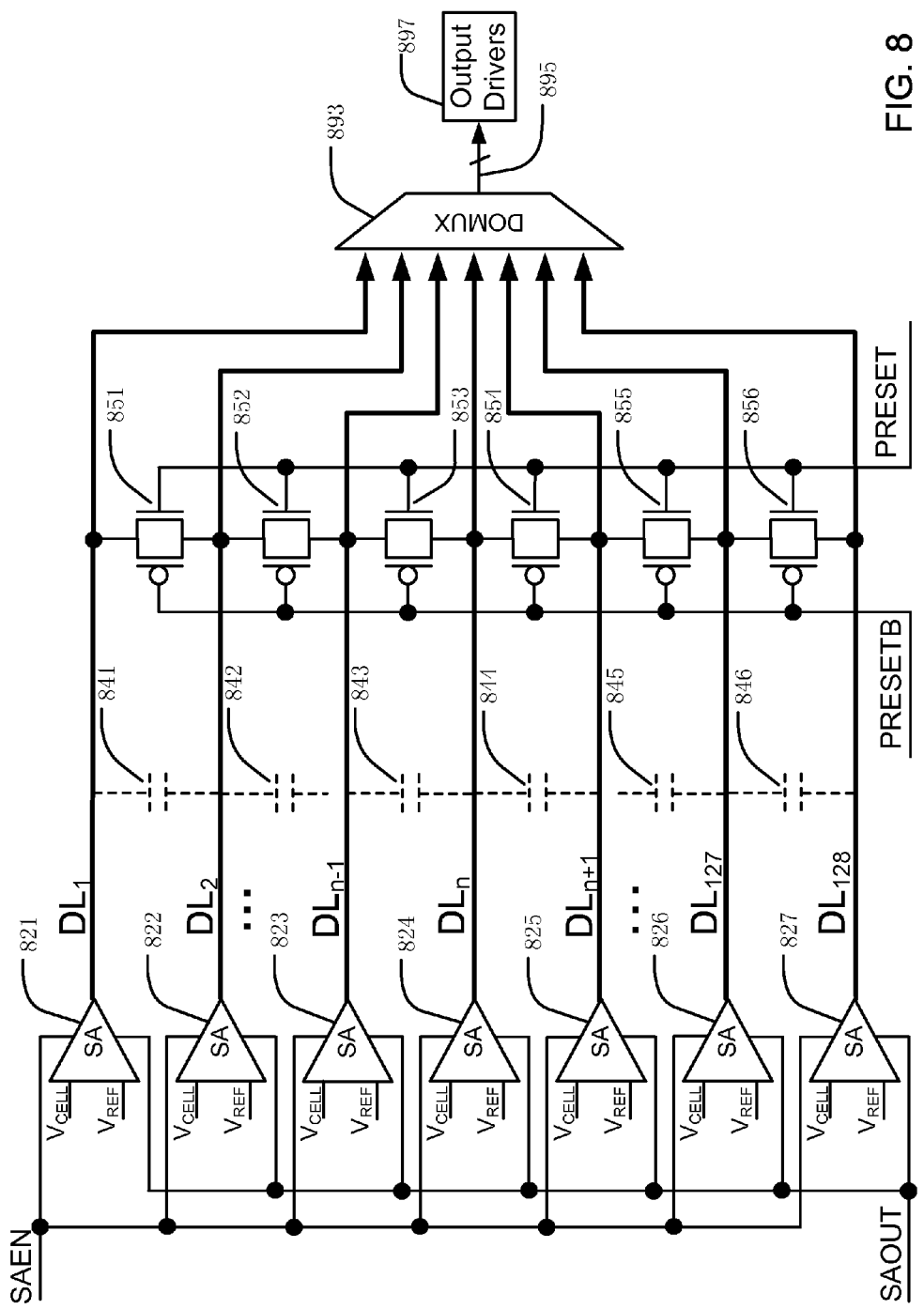
FIG. 8 is a schematic diagram illustrating a second embodiment of precharge circuits configured to apply a precharge voltage on output data lines in a memory device in accordance with the present invention.

FIG. 8 is a schematic diagram illustrating a second embodiment of precharge circuits configured to apply a precharge voltage on output data lines in a memory device in accordance with the present invention. The memory device includes an array of memory cells. The memory device includes a plurality of sense amplifiers coupled with the array, a plurality of output data lines receiving outputs of corresponding sense amplifiers in the plurality of sense amplifiers, and a plurality of precharge circuits configured to apply a precharge voltage on the output data lines. The output data lines carry sensed data from outputs of sense amplifiers to data output multiplexers 893. Data output multiplexers 893 select sensed data on 128 output data lines from a memory bank, and provide sensed data from a subset of the 128 output data lines to output drivers 897 via data lines 895.

In the example shown in FIG. 8, a memory device includes a plurality of output data lines including output data lines $DL_1$, $DL_2$, ..., $DL_{n-1}$, $DL_n$, $DL_{n+1}$, ..., $DL_{127}$, and $DL_{128}$. In embodiments, the number of output data lines can be 64, 128, 256 etc, corresponding to the number of columns in a memory array. Each output data line is coupled to at least an output of a sense amplifier. For instance, output data lines $DL_1$, $DL_2$, $DL_{n-1}$, $DL_n$, $DL_{n+1}$, $DL_{127}$, and $DL_{128}$ are coupled to outputs of sense amplifiers 821-827. FIG. 8 illustrates parasitic capacitances 841-846 between output data lines $DL_1$, $DL_2$, ..., $DL_{n-1}$, $DL_n$, $DL_{n+1}$, $DL_{127}$, and $DL_{128}$. As an example, parasitic capacitance 841 is between adjacent output data lines $DL_1$ and $DL_2$, and parasitic capacitance 846 is between adjacent output data lines $DL_{127}$ and $DL_{128}$.

In the example shown in FIG. 8, each of the sense amplifiers 821-827 has a sense node $V_{CELL}$, a second input coupled to a reference voltage $V_{REF}$, and an output driving an output data line. The sense node $V_{CELL}$ is coupled to a selected memory cell in a memory array. A sensing signal SAEN and an output control signal SAOUT are coupled to each of the sense amplifiers 821-827.

In this embodiment, a precharge circuit (e.g. 851) has a first terminal coupled to an output data line (e.g. $DL_1$), a second terminal coupled to an adjacent output data line (e.g. $DL_2$) in the plurality of output data lines, and a gate terminal coupled to the precharge signal PRESETB. As illustrated in FIG. 8, precharge circuits 851-856 are coupled to output data lines $DL_1$, $DL_2$, $DL_{n-1}$, $DL_n$, $DL_{n+1}$, $DL_{127}$, and $DL_{128}$.

In the example shown in FIG. 8, the precharge circuit (e.g. 851) is a CMOS transistor which has a second gate terminal coupled to a complementary precharge signal PRESET provided by the controller. The complementary precharge signal has a polarity opposite the polarity of the precharge signal. Alternatively, the precharge circuit can be a PMOS transistor, or an NMOS transistor.

Figure 9:
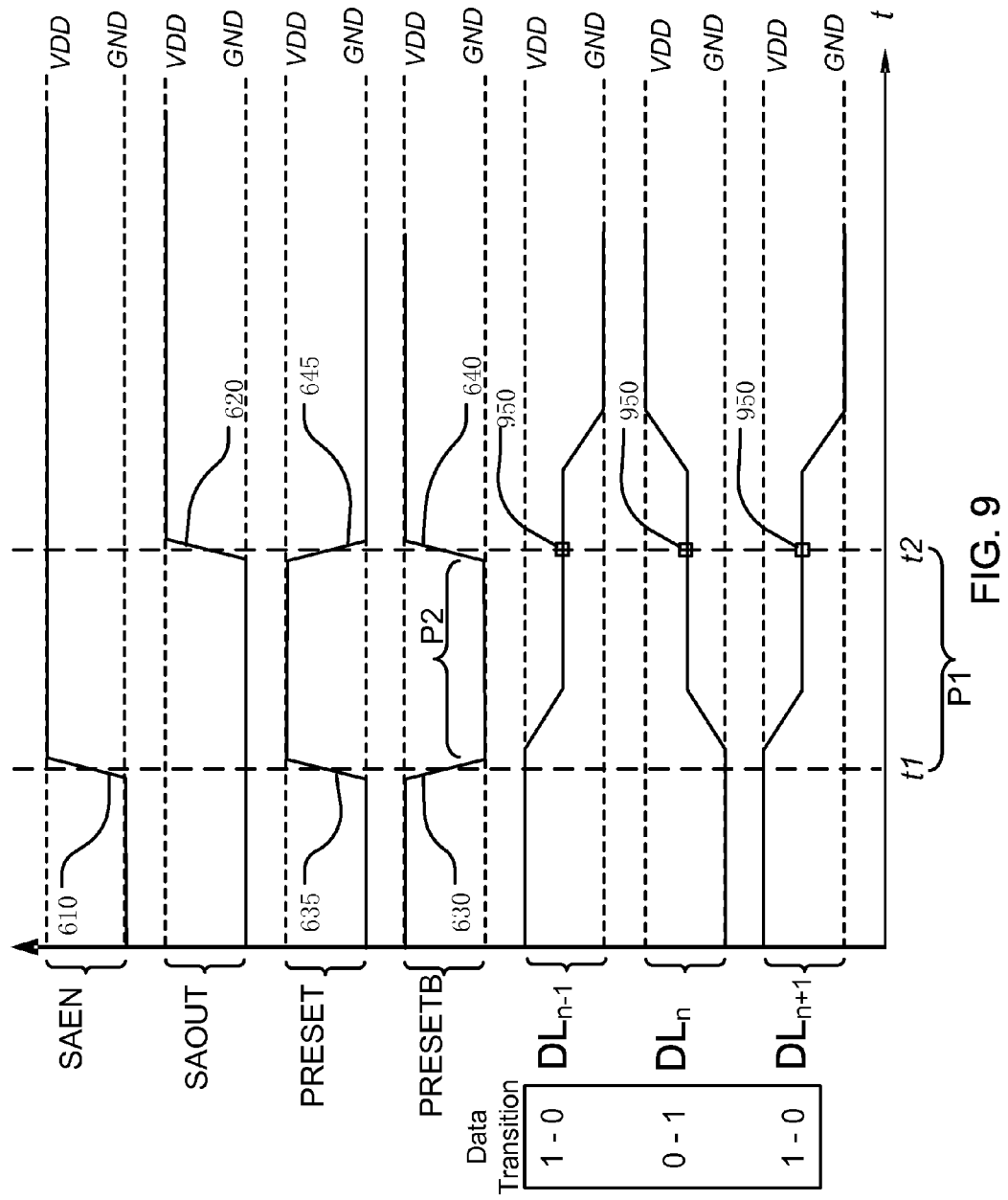
FIGS. 9 and 10 are timing diagrams for the embodiment of precharge circuits illustrated in FIG. 8.
Figure 10:
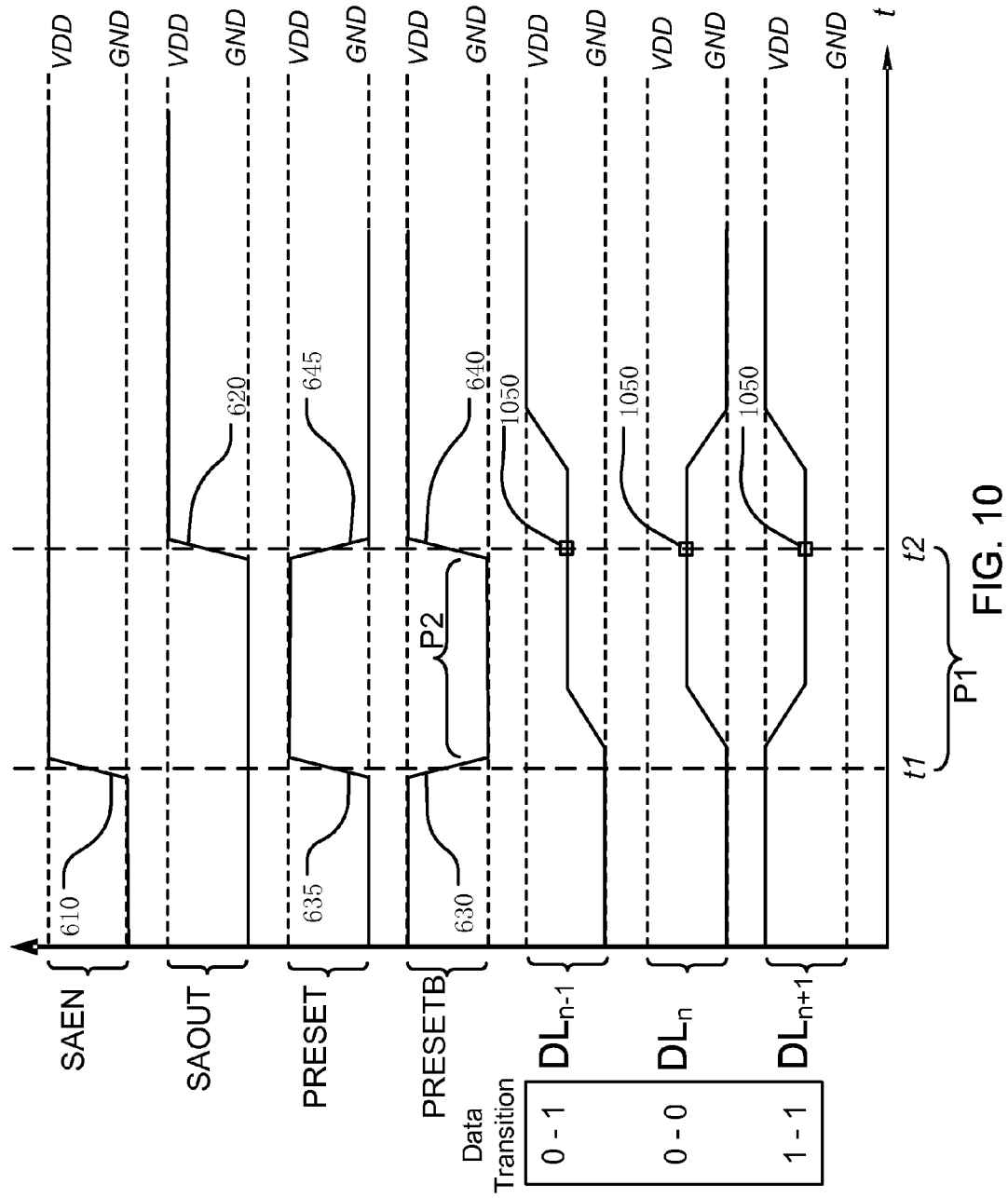

FIGS. 9 and 10 are timing diagrams for the embodiment of precharge circuits illustrated in FIG. 8. In the examples shown in FIGS. 9 and 10, data on output data lines $DL_{n-1}$, $DL_n$, and $DL_{n+1}$ switch between a first voltage level VDD corresponding to data at logic high and a second voltage level GND corresponding to data at logic low. FIG. 9 illustrates a sensing interval P1 between the transition 610 from logic low to logic high in the sensing signal SAEN at a first time t1, and the transition 620 from logic low to logic high in the output control signal SAOUT at a second time t2 subsequent to the first time t1. Alternatively, the transition in the sensing signal SAEN can be from logic high to logic low, and the transition in the output control signal SAOUT can be from logic high to logic low.

FIG. 9 illustrates a precharge interval P2 shorter than or equal to the sensing interval P1 starting at or after the first time t1, and ends at or before the second time t2. In the example shown in FIG. 9, the precharge interval P2 is between the transition 630 from logic high to logic low in the precharge signal PRESETB, and the transition 640 from logic low to logic high in the precharge signal PRESETB. Alternatively, the transition 630 can be from logic low to logic high, and the transition 640 can be from logic high to logic low. FIG. 9 also illustrates a complementary precharge signal PRESET generated by the controller and having a polarity opposite the polarity of the precharge signal PRESETB.

In the example shown in FIG. 9, during an initial interval that ends at the first time t1, data on output data lines $DL_{n-1}$, $DL_n$, and $DL_{n+1}$ are retained from previous sensing operations. During the sensing interval P1 between the first time t1 and the second time t2, sense amplifiers are enabled to sense data at data inputs of the sense amplifiers in response to the sensing signal SAEN. During the precharge interval P2, data on output data lines $DL_{n-1}$, $DL_n$, and $DL_{n+1}$ change from voltage levels retained from previous sensing operations to a precharge voltage 950 in response to the precharge signal PRESETB and the complementary precharge signal PRESET. As shown in FIG. 9, the precharge voltage 950 is at a voltage level between a first voltage level VDD corresponding to data at logic high and a second voltage level GND corresponding to data at logic low, depending on the voltage levels retained from previous sensing operations on the output data lines.

The precharge signal PRESETB and the complementary precharge signal PRESET can turn on a precharge circuit (e.g. 854, FIG. 8) coupled to two adjacent output data lines (e.g. $DL_n$ and $DL_{n+1}$, FIG. 8) during the precharge interval P2, and turn off the precharge circuit before and after the precharge interval P2. When precharge circuits are turned on, output data lines (e.g. $DL_{n-1}$, $DL_n$, and $DL_{n+1}$) are precharged from voltage levels retained from previous sensing operations to the precharge voltage 950. Since the output data lines (e.g. $DL_1$, $DL_2$, $DL_{n-1}$, $DL_n$, $DL_{n+1}$, $DL_{127}$, and $DL_{128}$) are connected via the precharge circuits (e.g. 851-856) when the precharge circuits are turned on, the precharge voltage 950 can be at an "equalized" voltage level between the voltage level VDD corresponding to data at logic high and the voltage level GND corresponding to data at logic low, depending on the respective voltage levels retained on output data lines from previous sensing operations.

After the sensing interval P1, the output data line is driven from the precharge voltage 950 to an output voltage level corresponding to data sensed at the sense node $V_{CELL}$ of the sense amplifier driving the output data line. The output voltage level includes VDD and GND.

Description about the timing diagram in FIG. 9 is generally applicable to the timing diagram in FIG. 10. In the example shown in FIG. 10, during an initial interval that ends at the first time t1, data on output data lines $DL_{n-1}$, $DL_n$, and $DL_{n+1}$ are retained from previous sensing operations. During the sensing interval P1 between the first time t1 and the second time t2, sense amplifiers are enabled to sense data at data inputs of the sense amplifiers in response to the sensing signal SAEN. During the precharge interval P2, data on output data lines $DL_{n-1}$, $DL_n$, $DL_{n+1}$ change from voltage levels retained from previous sensing operations to a precharge voltage 1050 in response to the precharge signal PRESETB and the complementary precharge signal PRESET. As shown in FIG. 10, the precharge voltage 1050 is at a voltage level between a first voltage level VDD corresponding to data at logic high and a second voltage level GND corresponding to data at logic low, depending on the voltage levels retained from previous sensing operations on the output data lines.

In the examples shown in FIGS. 9 and 10, after the sensing interval P1, data on output data lines $DL_{n-1}$, $DL_n$, and $DL_{n+1}$ change from an "equalized" voltage level 950 between VDD and GND to output voltage levels corresponding to sensed data, thus reducing amplitudes of voltage swings during data transfer from full amplitudes of voltage swings between VDD and GND, and thus improving reading speed on memory cells.

Consequently, in the present embodiment, a sense amplifier (e.g. 824 FIG. 8) coupled to an output data line (e.g. $DL_n$ FIG. 8) consumes less charge to drive the output data line to a different voltage level than in the prior art under the same worst case scenario. The charge consumed in the worst case can be reduced from 2×2×CC×VDD to 2×CC×VDD, where CC is the capacitance of a parasitic capacitance. The reduction from 2×2 to 2 is due to the fact that the maximum total voltage swing between two terminals of a parasitic capacitance is reduced to VDD from 2×VDD as described for the worst case example shown in FIG. 3.

In the example shown in FIG. 9, data transitions correspond to a worst case occurring with the prior art described in connection with FIG. 3. In the example shown in FIG. 10, data transitions illustrate a case other than the worst case. In both cases, the charge consumed is about 2×CC×VDD, or half of the charge consumed for the worst case with the prior art.

In the embodiments described herein, precharging operations are performed on output data lines driven by sense amplifiers during a precharge interval shorter than or equal to a sensing interval during which the sense amplifiers perform sensing operations. Typically, sensing operations are more complex and require longer time than precharging operations. For instance, sensing time can be 60 ns and precharge time can be 10 ns. Due to multiplicity of output data lines (e.g. 128 per bank, FIG. 1) presented to layout, output data lines are likely to have varying lengths and consequently varying capacitances. Since sensing operations require longer time than precharging operations, precharging operations are likely to complete even on output data lines with varying lengths in the precharge interval shorter than the sensing interval. Consequently, the precharging operations do not impact data rates in reading memory cells using the output data lines.

Figure 11:
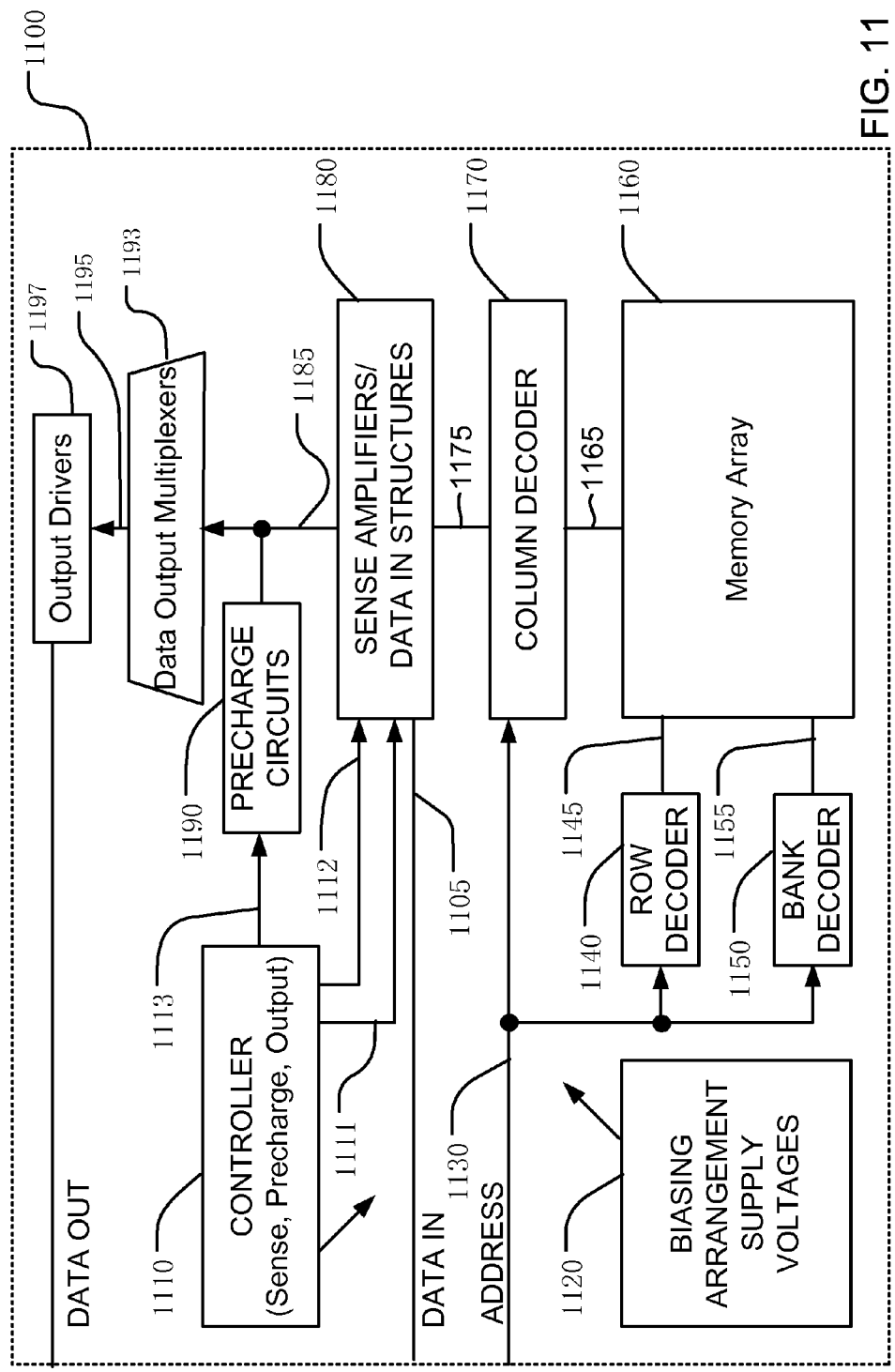
FIG. 11 is a simplified block diagram of a memory device according to an embodiment.

FIG. 11 is a simplified block diagram of a memory device according to an embodiment. The integrated circuit 1100 includes a memory array 1160 on an integrated circuit substrate. A row decoder 1140 is coupled to a plurality of word lines 845, and arranged along rows in the memory array 1100. A column decoder 1170 is coupled to a plurality of bit lines 1165 arranged along columns in the memory array 1160 for reading and programming data from the memory cells in the array 1160. A bank decoder 1150 is coupled to a plurality of banks in the memory array 1160 on bus 1155. Addresses are supplied on bus 1130 to column decoder 1170, row decoder 1140 and bank decoder 1150. Sense amplifiers and data-in structures in block 1180 are coupled to the column decoder 1170 in this example via data bus 1175. Data is supplied via the data-in line 1105 from input/output ports on the integrated circuit 1100 or from other data sources internal or external to the integrated circuit 1100, to the data-in structures in block 1180.

In the example shown in FIG. 11, data output multiplexers 1193 have inputs coupled to the output data lines 1185, precharge circuits 1190 are coupled to the output data lines 1185 between outputs of the sense amplifiers in the block 1180 and data output multiplexers 1193. Output drivers 1197 have inputs coupled to outputs of the data output multiplexers 1193 via data lines 1195. Data output multiplexers 1193 select sensed data on the output data lines 1185 from one of the memory banks in the memory array 1160. Output drivers 1197 drive selected sensed data to destinations external to the integrated circuit 1100.

For instance, a memory device can have N banks of memory cells and each bank can include 128 columns coupled to 128 output data lines. The data output multiplexers 1193 can select data from 128 output data lines of one memory bank, and the output drivers 1197 can output data from some of the 128 output data lines.

In the example shown in FIG. 11, a controller 1110 controls the sense amplifiers in the block 1180 and the precharge circuits 1190, including to cause the precharge circuits 1190 to precharge the output data lines 1185 before the sense amplifiers drive output data signals to the output data lines 1185. In the example shown in FIG. 11, the controller 110 provides control signals that can include a sensing signal 1111, an output signal 1112, and a precharge signal 1113. The precharge signal is generated as a function of at least one of the sensing signal 1111 and the output signal 1112. The controller 1110 enables sense amplifiers in the plurality of sense amplifiers to sense data at data inputs of the sense amplifier during a sensing interval starting at a first time via the sensing signal 1111. The controller 1110 enables the sense amplifiers to output sensed data to the output data lines at a second time subsequent to the first time via the output signal 1112. The controller enables the precharge circuits in block 1190 to precharge output data lines 1185 during a precharge interval prior to the second time via the precharge signal 1113.

The controller 1110 using a bias arrangement state machine controls the application of bias arrangement supply voltage generated or provided through the voltage supply or supplies in block 1120, such as read and program voltages. The controller 1110 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

In the example shown in FIG. 11, precharge circuits in block 1190 are coupled to the outputs of sense amplifiers in block 1180 via output data lines 1185. The controller 1110 provides a precharge signal 1113 coupled to the precharge circuits in block 1190. The precharge signal 1113 turns on the precharge circuits in block 1190 during a precharge interval, and turns off the precharge circuits before and after the precharge interval.

In general, the embodiments of methods and devices described herein for improving reading speed on output data lines of sense amplifiers can be applied to data lines placed closely together in integrated circuits for other functions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
an array of memory cells;
a plurality of sense amplifiers coupled with the array;
a plurality of output data lines connected to outputs of corresponding sense amplifiers in the plurality of sense amplifiers, the sense amplifiers driving voltages corresponding to sensed data values on the output data lines;
a plurality of precharge circuits configured to apply a precharge voltage on the output data lines, wherein the precharge circuits precharge the output data lines before the sense amplifiers drive output data signals to the output data lines; and
a controller that provides control signals to the sense amplifiers in the plurality of sense amplifiers and to the precharge circuits in the plurality of precharge circuits,
wherein the controller enables the sense amplifiers to sense data at data inputs of the sense amplifiers during a sensing interval starting at a first time and ending at a second time subsequent to the first time, and enables the precharge circuits to precharge the output data lines during a precharge interval starting at or after the first time and ending prior to the second time.

2. The memory device of claim 1, wherein the controller enables the sense amplifiers to output sensed data to the output data lines at the second time.

3. The memory device of claim 1, wherein the plurality of sense amplifiers includes a plurality of banks of sense amplifiers, and each bank includes a sense amplifier having an output driving each output data line in the plurality of output data lines.

4. The memory device of claim 1, including a data output multiplexer which couples selected subsets of the plurality of output data lines to a multiplexer output, and said precharge circuits being coupled to the output data lines between the sense amplifier outputs and the inputs of the data output multiplexer.

5. The memory device of claim 1, wherein the precharge interval is shorter than or equal to the sensing interval.

6. The memory device of claim 1, wherein the precharge interval ends at or before the second time.

7. The memory device of claim 1, wherein a precharge circuit in the plurality of precharge circuits includes a first terminal coupled to the precharge voltage, a second terminal coupled to an output data line in the plurality of output data lines, and a gate terminal coupled to the controller.

8. The memory device of claim 7, wherein the precharge circuit includes a CMOS transistor, and the CMOS transistor has a second gate terminal coupled to the controller.

9. The memory device of claim 1, comprising:
a circuit that generates a precharge signal from at least one of the control signals,
wherein a precharge circuit in the plurality of precharge circuits includes a first terminal coupled to the precharge voltage, a second terminal coupled to an output data line in the plurality of output data lines, and a gate terminal coupled to the precharge signal.

10. The memory device of claim 7, comprising:
a circuit that generates a second precharge signal from at least one of the control signals,
wherein the precharge circuit includes a CMOS transistor, and the CMOS transistor has a second gate terminal coupled to the second precharge signal.

11. The memory device of claim 1, wherein a precharge circuit in the plurality of precharge circuits includes a first terminal coupled to an output data line in the plurality of output data lines, a second terminal coupled to an adjacent output data line in the plurality of output data lines, and a gate terminal coupled to the controller.

12. The memory device of claim 11, wherein the precharge circuit includes a CMOS transistor, and the CMOS transistor has a second gate terminal coupled to the controller.

13. The memory device of claim 1, comprising:
a circuit that generates a precharge signal from at least one of the control signals,
wherein a precharge circuit in the plurality of precharge circuits includes a first terminal coupled to an output data line in the plurality of output data lines, a second terminal coupled to an adjacent output data line in the plurality of output data lines, and a gate terminal coupled to the precharge signal.

14. The memory device of claim 11, comprising:
a circuit that generates a second precharge signal from at least one of the control signals,
wherein the precharge circuit includes a CMOS transistor, and the CMOS transistor has a second gate terminal coupled to the second precharge signal.

15. The memory device of claim 1, wherein the precharge voltage includes a voltage level corresponding to data at logic high.

16. The memory device of claim 1, wherein the precharge voltage includes a voltage level corresponding to data at logic low.

17. The memory device of claim 1, wherein the precharge voltage is at a voltage level between a first voltage level corresponding to data at logic high and a second voltage level corresponding to data at logic low.

18. The memory device of claim 1, including:
a data output multiplexer coupled to the plurality of output data lines to select from among output data lines in the plurality of output data lines carrying sensed data; and
output drivers that drive selected sensed data from the data output multiplexer to destinations external to the memory device.

19. A method for sensing data in a memory device, the memory device comprising an array of memory cells, a plurality of sense amplifiers coupled with the array, a plurality of output data lines connected to outputs of corresponding sense amplifiers in the plurality of sense amplifiers, the sense amplifiers driving voltages corresponding to sensed data values on the output data lines, and a plurality of precharge circuits configured to apply a precharge voltage on the output data lines, the method comprising:

controlling the sense amplifiers in the plurality of sense amplifiers and the precharge circuits, including enabling the sense amplifiers in the plurality of sense amplifiers to sense data at data inputs of the sense amplifiers during a sensing interval starting at a first time and ending at a second time subsequent to the first time; and enabling the precharge circuits to precharge the output data lines during a precharge interval starting at or after the first time and ending prior to the second time.

20. The method of claim 19, the controlling comprising:
outputting sensed data to the output data lines starting at the second time.

21. The method of claim 19, wherein the precharge interval is shorter than or equal to the sensing interval.

22. The method of claim 19, wherein the precharge interval ends at or before the second time.

23. The method of claim 19, wherein the enabling the precharge circuits includes turning on a precharge circuit in the plurality of precharge circuits during the precharge interval, and turning off the precharge circuit before and after the precharge interval.

24. The method of claim 19, further comprising selecting sensed data on the output data lines, and outputting the selected sensed data.

25. The method of claim 19, wherein the precharge voltage includes a voltage level corresponding to data at logic high.

26. The method of claim 19 wherein the precharge voltage includes a voltage level corresponding to data at logic low.

27. The method of claim 19, wherein the precharge voltage is at a voltage level between a first voltage level corresponding to data at logic high and a second voltage level corresponding to data at logic low.

* * * * *